United States Patent
Ohta et al.

(10) Patent No.: US 8,680,606 B2
(45) Date of Patent: Mar. 25, 2014

(54) POWER SEMICONDUCTOR DEVICE

(75) Inventors: Hiroshi Ohta, Hyogo-ken (JP); Yasuto Sumi, Hyogo-ken (JP); Kiyoshi Kimura, Hyogo-ken (JP); Junji Suzuki, Hyogo-ken (JP); Hiroyuki Irifune, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/424,344

(22) Filed: Mar. 19, 2012

(65) Prior Publication Data

US 2012/0241823 A1 Sep. 27, 2012

(30) Foreign Application Priority Data

Mar. 23, 2011 (JP) ................................. 2011-064669

(51) Int. Cl.
*H01L 29/66* (2006.01)
(52) U.S. Cl.
USPC ........................................................ 257/327
(58) Field of Classification Search
USPC ................. 257/341, 135, 136, 302, 263–267, 257/328–335, 342, 288, 409, E29.005, 257/E29.008; 438/268, 286, 514
See application file for complete search history.

(56) References Cited

U.S. PATENT DOCUMENTS

| | | | |
|---|---|---|---|
| 7,605,426 B2 | 10/2009 | Saito et al. | |
| 2003/0008483 A1* | 1/2003 | Sato et al. | 438/514 |
| 2007/0132012 A1* | 6/2007 | Saito | 257/327 |
| 2010/0102381 A1 | 4/2010 | Saito et al. | |
| 2010/0308399 A1* | 12/2010 | Saito et al. | 257/329 |
| 2011/0291181 A1 | 12/2011 | Irifune et al. | |

FOREIGN PATENT DOCUMENTS

| | | |
|---|---|---|
| JP | 2004-006598 | 1/2004 |
| JP | 2009-094314 | 4/2009 |
| JP | 2010-067737 | 3/2010 |

OTHER PUBLICATIONS

Japanese Office Action dated Jul. 23, 2013, filed in Japanese counterpart Application No. 2011-064669, 6 pages (with translation).

* cited by examiner

*Primary Examiner* — Steven Loke
*Assistant Examiner* — Mouloucoulaye Inoussa
(74) *Attorney, Agent, or Firm* — Patterson & Sheridan, LLP

(57) ABSTRACT

A power semiconductor device includes a first semiconductor layer of a first conductivity type, a second semiconductor layer provided thereon, mutually separated columnar third semiconductor layers of a second conductivity type extending within the second semiconductor layer, island-like fourth semiconductor layers of the second conductivity type provided on the third semiconductor layers, fifth semiconductor layers of the first conductivity type, sixth semiconductor layers of the second conductivity type, a gate electrode, a first electrode, and a second electrode. The fifth semiconductor layers are selectively provided on the fourth semiconductor layers. The sixth semiconductor layer electrically connects two adjacent fourth semiconductor layers. The first electrode is in electrical connection with the first semiconductor. The second electrode is in electrical connection with the fourth semiconductor layers and the fifth semiconductor layers via the openings in the gate electrode.

5 Claims, 11 Drawing Sheets

US 8,680,606 B2

POWER SEMICONDUCTOR DEVICE

CROSS-REFERENCE TO RELATED APPLICATION

This application is based upon and claims the benefit of priority from the prior Japanese Patent Application No. 2011-064669, filed on Mar. 23, 2011; the entire contents of which are incorporated herein by reference.

FIELD

Embodiments described herein relate generally to a power semiconductor device.

BACKGROUND

Generally, the on resistance of vertical power MOSFETs (Metal Oxide Semiconductor Field Effect Transistor) is strongly dependent on the electrical resistance of the drift layer. If the impurity concentration is raised to lower the electrical resistance of the drift layer, the withstand voltage at the p-n junction interface between the base layer and the drift layer is reduced. Thus, there is a tradeoff between having a low on resistance and withstand voltage. To improve the tradeoff a super junction structure is used in which multiple n-type semiconductor layers and p-type semiconductor layers are arranged in the drift layer. In the super junction structure, a quantity of p-type impurities in the p-type semiconductor layer and a quantity of n-type impurities in the n-type semiconductor layer are arranged to be equal. Hence, even if the p-type and n-type impurity concentrations are high, the drift layer is fully depleted, and the high withstand voltage can be maintained. Further, to lower the on resistance, a structure is used whereby the p-type semiconductor layer is formed to be columnar within the super junction structure, and an island-like p-type base layer is formed a top portion thereof. In the structure, the channel density is increased by forming a lattice-form, offset lattice-form, or honeycomb-form gate electrode bridging among the island-like p-type base layers, and a low on resistance can thus be realized. However, since the p-type base layer and the n-type source layers are electrically connected via an opening of the gate electrode, the effects of contact defects between the p-type base layer and the source electrode increase as miniaturization proceeds. Consequently, discharge of electron holes to the source electrode at avalanche breakdown is suppressed and avalanche resistance is reduced.

DETAILED DESCRIPTION

Figure 1:
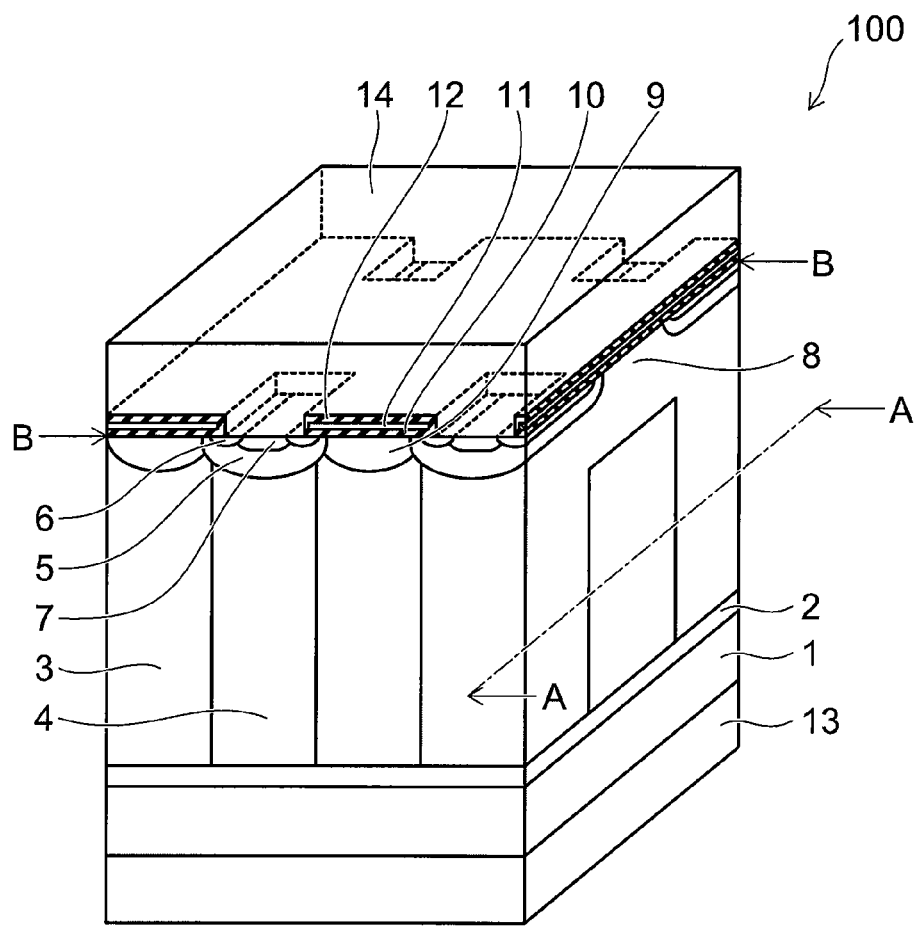
FIG. 1 is a perspective view of a main constituents of a power semiconductor device according to a first embodiment.

A power semiconductor device includes a first semiconductor layer of a first conductivity type, a second semiconductor layer, a plurality of mutually separated columnar third semiconductor layers of a second conductivity type, a plurality of island-like fourth semiconductor layers of the second conductivity type, a plurality of fifth semiconductor layers of the first conductivity type, a plurality of sixth semiconductor layers of the second conductivity type, a gate electrode, an interlayer insulating film, a first electrode, and a second electrode. The first semiconductor layer has a first major surface. The second semiconductor layer has an impurity concentration of the first conductivity type lower than an impurity concentration of the first conductivity type of the first semiconductor layer and is provided on the first major surface of the first semiconductor layer. Each of the plurality of third semiconductor layers extends within the second semiconductor layer from a surface of a side of the second semiconductor layer opposite the first semiconductor layer towards the first semiconductor layer. Each of the plurality of island-like fourth semiconductor layers is provided on a top end of a corresponding one of the plurality of third semiconductor layers and has an impurity concentration of the second conductivity type higher than an impurity concentration of the second conductivity type of the third semiconductor layers. Each the plurality of fifth semiconductor layers is selectively provided on a top surface of a corresponding fourth semiconductor layer and has an impurity concentration higher than the impurity concentration of the first conductivity type of the second semiconductor layer. Each of the plurality of sixth semiconductor layers electrically connects two adjacent fourth semiconductor layers of the plurality of fourth semiconductor layers and has an impurity concentration of the second conductivity type lower than the impurity concentration of the second conductivity type of the fourth semiconductor layers. The gate electrode is provided via a gate insulating film on the second semiconductor layer, the plurality of sixth semiconductor layers, the plurality of fourth semiconductor layers and the plurality of fifth semiconductor layers. The gate electrode includes a plurality of openings over the plurality of fourth semiconductor layers and the plurality of fifth semiconductor layers. The interlayer insulating film covers the gate electrode. The first electrode is in electrical connection with a second major surface of a side of the first semiconductor layer opposite the first major surface. The second electrode is insulated from the gate electrode by the interlayer insulating film and is in electrical connection with the plurality of fourth semiconductor layers and the plurality of fifth semiconductor layers via the openings in the gate electrode.

Embodiments of the invention will now be described with reference to the drawings. The drawings used in the description of the embodiments are schematic drawings to facilitate explanation. The forms, dimensions, size relationships and the like of the constituent elements in actual embodiments are not restricted to those shown in the drawings, but may be modified appropriately within ranges over which the effects of the invention can be obtained. Where there are no special requirements, the embodiments are described using examples in which the semiconductor material is silicon. An example is described in which a first conductivity type is n-type and a second conductivity type is p-type, but these may naturally be reversed. An n-type impurity concentration and a p-type impurity concentration refer to a net n-type impurity concentration and a net p-type impurity concentration respectively, which is to say the concentrations of the n-type impurities and the p-type impurities after compensation. Further, when $n^-$-type, n-type and $n^+$-type materials are used, there is a relationship associated with the impurity concentration as: $n^-<n<n^+$. The same applies to $p^-$-type, p-type, and $p^+$-type materials.

First Embodiment

Figure 2A:
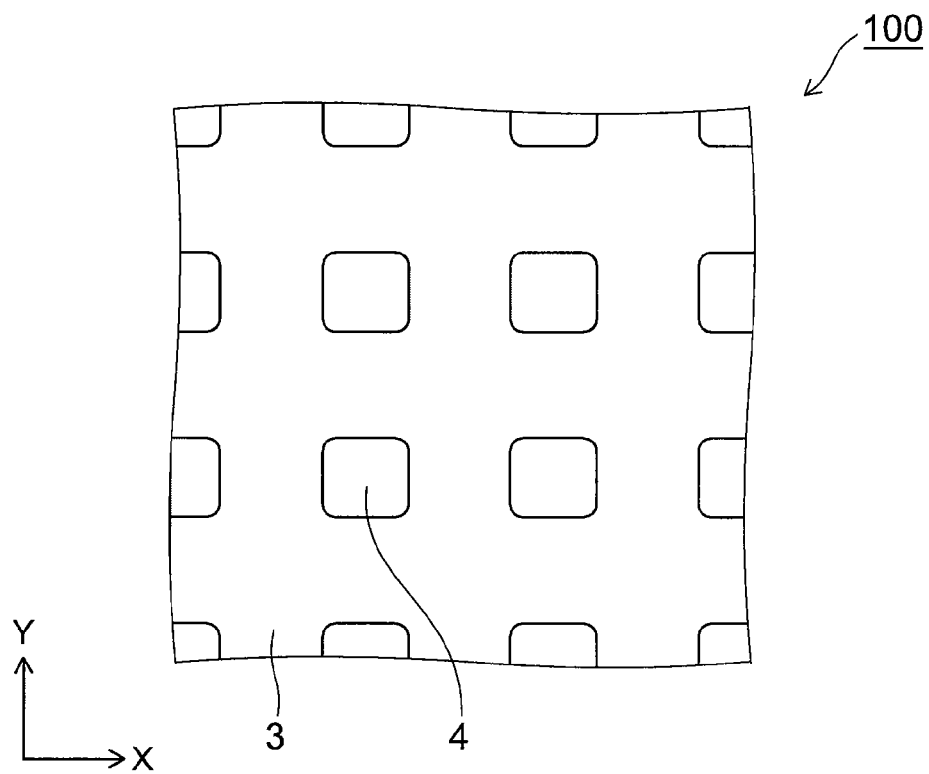
FIG. 2A is a plan view of the main constituents in a horizontal plane through A-A in the perspective view of FIG. 1.
Figure 2B:
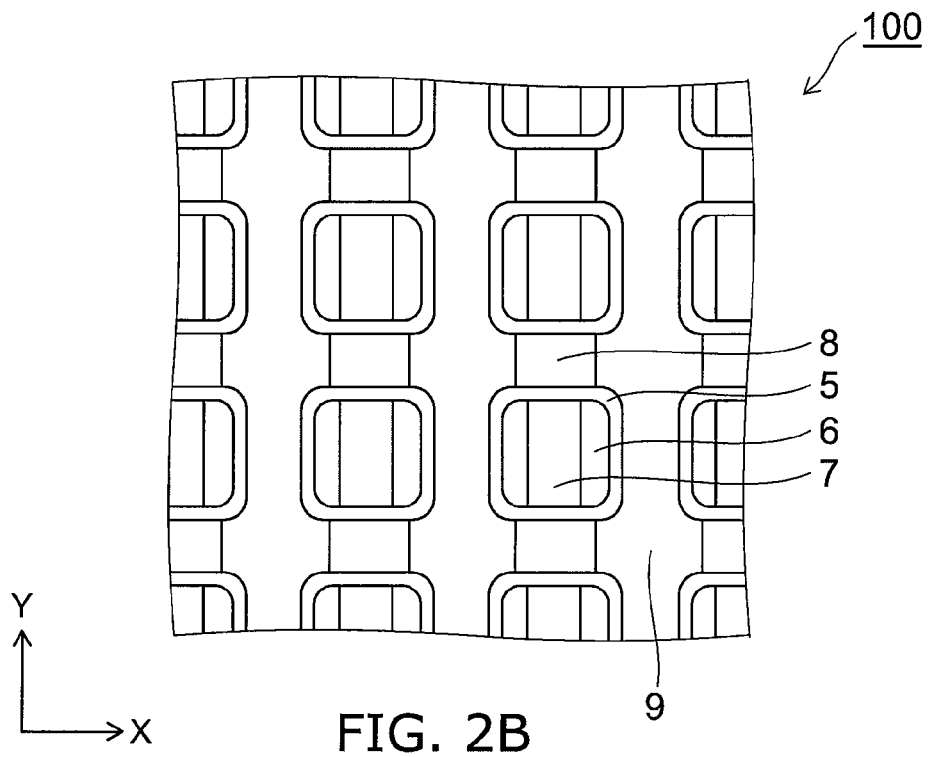
FIG. 2B is plan view of the main constituents in the horizontal plane through B-B in the perspective view of FIG. 1.
Figure 3:
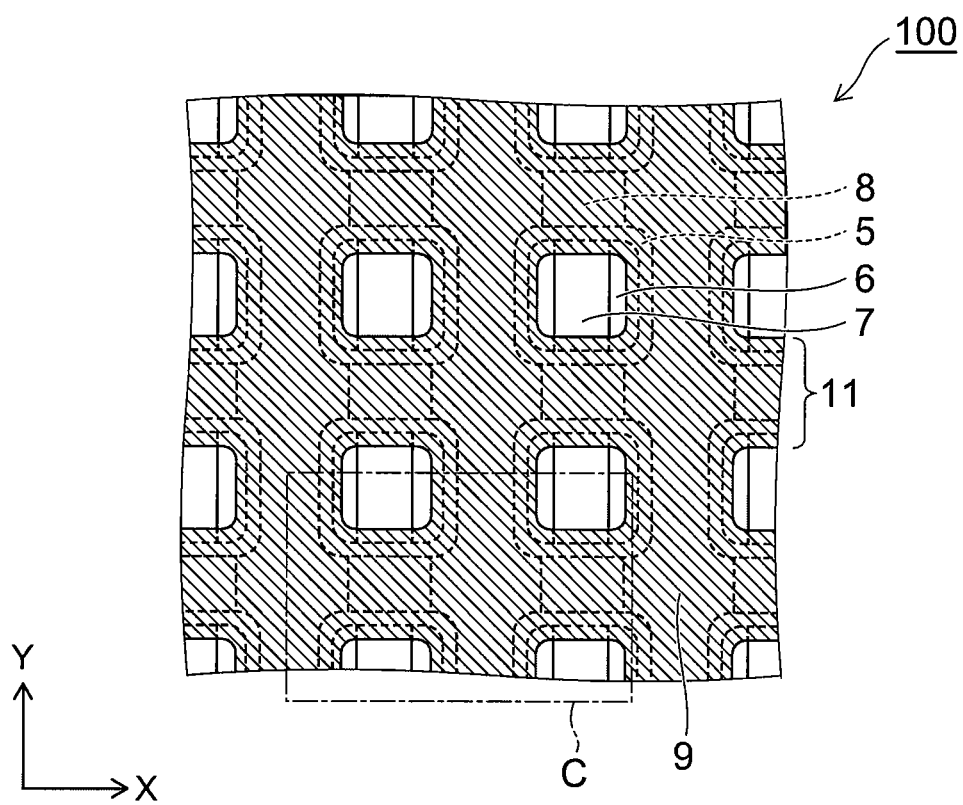
FIG. 3 is a plan view of the main constituents of the power semiconductor device according to the first embodiment, showing the same portion as the perspective view of FIG. 1 viewed from above with a source electrode 14 and an interlayer insulating film 12 omitted.
Figure 4:
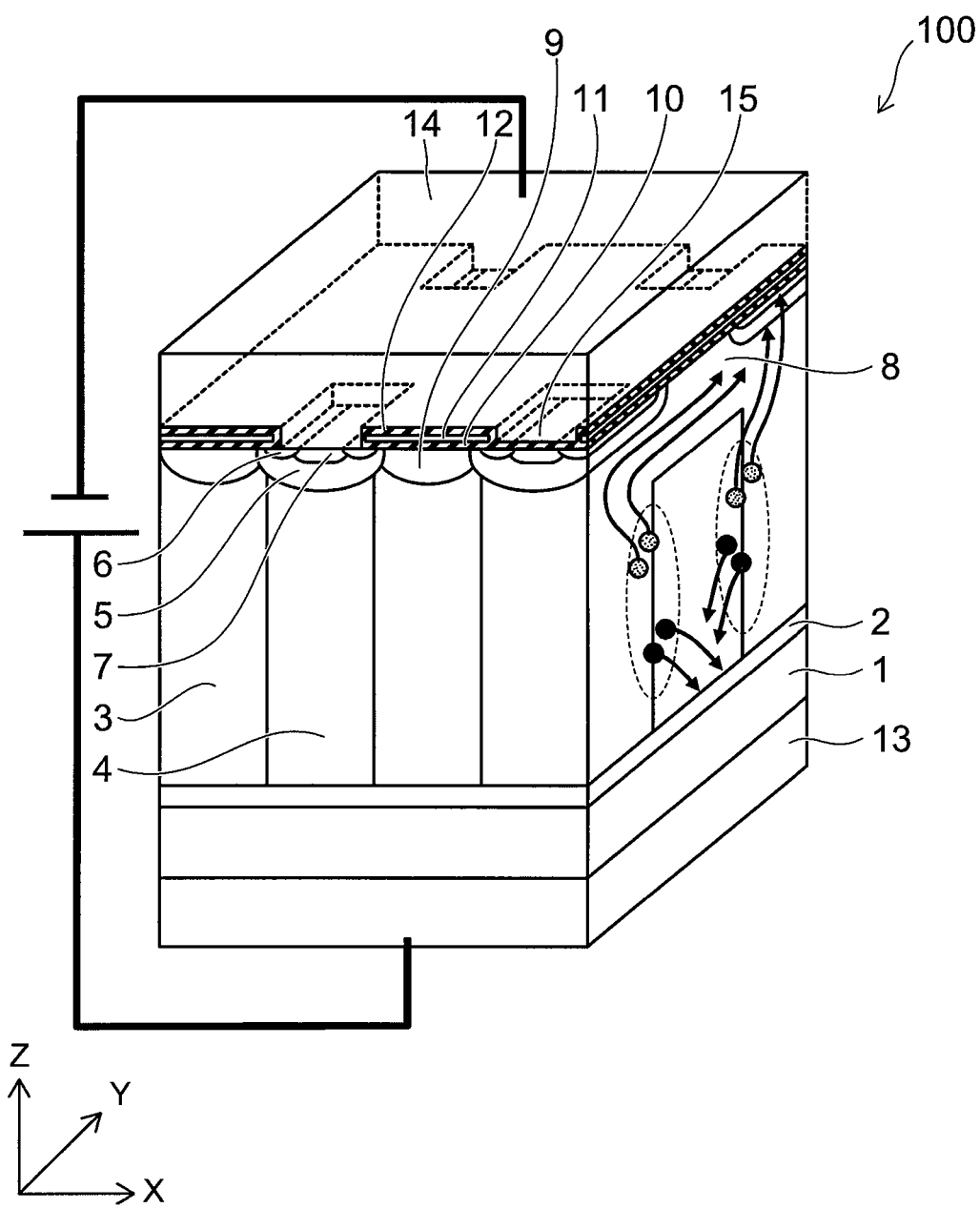
FIG. 4 is a perspective view of the main constituents for explaining operations of the power semiconductor device according to the first embodiment.

A first embodiment is described with reference to FIGS. 1 to 4. FIG. 1 is a perspective view of the main constituents of a power semiconductor device 100 according to the first embodiment. FIG. 2A is a plan view of the main constituents in a horizontal plane through A-A in the perspective view of FIG. 1 and FIG. 2B is plan view of the main constituents in the horizontal plane through B-B in the perspective view of FIG. 1, both FIG. 2A and FIG. 2B illustrating the power semiconductor device according to the first embodiment. FIG. 3 is a plan view of the main constituents of the power semiconductor device according to the first embodiment, showing the same portion as the perspective view of FIG. 1 viewed from above with a source electrode 14 and an interlayer insulating film 12 omitted. The broken line indicates a layer hidden under a gate electrode 11. The area marked out by the broken line C corresponds to the area illustrated in the perspective view of FIG. 1. FIG. 4 is a perspective view of the main constituents for explaining operations of the power semiconductor device according to the first embodiment. FIGS. 1 to 4 each illustrates a main portion of the device regions through which a current of a MOSFET 100 flows. Since edge regions which are regions outside the device regions are not within the scope of the invention, descriptions of such regions have been omitted.

As illustrated in FIGS. 1 to 3, the power semiconductor device 100 according to the first embodiment is described by taking a MOSFET as an example, and includes an $n^+$-type (first conductivity type) drain layer (first semiconductor layer) 1 having a first major surface, an n-type pillar layer (second semiconductor layer) 3, a plurality of columnar p-type (second conductivity type) pillar layers (third semiconductor layer) 4, a plurality of island-like p-type base layers (fourth semiconductor layer) 5, a plurality of $n^+$-type source layers (fifth semiconductor layer) 6, a plurality of p-type base junction layers (sixth semiconductor layer) 8, a gate electrode 11, an interlayer insulating layer 12, a first electrode 13 and a second electrode 14. For example, for the $n^+$-type drain layer 1, a silicon substrate having a first major surface and a second major surface that opposes the first major surface is used. After forming the required layers, which are described below, on the first major surface of the silicon substrate, the $n^+$-type drain layer 1 is formed by grinding the second major surface side to give the silicon substrate a predetermined thickness. The $n^-$-type buffer layer 2 is provided on a first major surface of the $n^+$-type drain layer 1. The $n^-$-type buffer layer 2 is, for example, formed by epitaxial growth.

The n-type pillar layer 3 is provided on the $n^-$-type buffer layer 2. An impurity concentration of the n-type pillar layer 3 is lower than the n-type impurity concentration of the $n^+$-type drain layer 1. The plurality of p-type pillar layers 4 is provided in the n-type pillar layer 3 and has a columnar structure that extends within the n-type pillar layer 3 from a surface of a side of the n-type pillar layer 3 opposite the $n^+$-type drain layer 1 towards the $n^+$-type drain layer 1. Each of the plurality of p-type pillar layers is separated from the others by interposing the n-type pillar layer 3. In this embodiment, the p-type pillar layer 4 reaches the $n^-$-type buffer layer 2, but need not reach as far as the $n^-$-type buffer layer 2 and may stop instead in the n-type pillar layer 3. In other words, the n-type pillar layer 3 may be interposed between the plurality of p-type pillar layers 4 and the $n^-$-type buffer layers 2. In this embodiment, as illustrated in FIG. 2A, the plurality of p-type pillar layers 4 are arranged along a plurality of columns (not shown). The columns extend in a Y direction (first direction) parallel to the first major surface of the $n^+$-type drain layer 1 and are disposed by an equal interval in an X direction (second direction) that is parallel to the first major surface and perpendicular to the Y direction. In each Y direction column, the p-type pillar layers 4 are disposed with an equal interval in the Y direction. Thus, a super junction structure is formed as a drift layer on the $n^-$-type buffer layer 2 whereby, when the first major surface is viewed along a normal direction to the first major surface, the plurality of columnar p-type pillar layers 4 that extend in the normal direction are seen to be arranged in lattice-form within the n-type pillar layer 3.

As a result of the plurality of p-type pillar layers 4 being provided in lattice-form in the n-type pillar layer 3, the n-type pillar layer 3 has a lattice form with stripes extending in the Y direction and the X direction. In other words, the plurality of p-type pillar layers 4 arranged in lattice-form correspond to the openings of the lattice formed by the n-type pillar layer 3 having the lattice form. Note that although the $n^-$-type pillar layer 3 has the lattice form with stripes extending in Y direction and the X direction rather than a columnar structure, when viewed in cross-section as in the perspective view of FIG. 1, the structure of the n-type pillar layer 3 resembles the columnar structure of the p-type pillar layer 4, and, for this reason and for the sake of convenience, is described as being a pillar layer. The same applies to subsequent embodiments.

The size of each pillar and ion injection dosage of each impurity are set in such a way that the quantities of impurities in the adjacent n-type pillar layer 3 and the p-type pillar layer 4 are approximately the same. With this arrangement, the super junction structure is easily depleted notwithstanding the high impurity concentration in the pillars, and it is therefore possible to lower drift resistance while maintaining a high withstand voltage in the drift layer.

The n-type pillar layer 3 and the p-type pillar layers 4 can be formed, for example, in the manner described below. After forming an n⁻-type epitaxial layer having a similar impurity concentration to the n⁻-type buffer layer 2 on the n⁻-type buffer layer 2, p-type impurities are ion-injected in positions to form the p-type pillar layers 4 and n-type impurities are ion-injected at positions to form the n-type pillar layers 3 from the surface of the n⁻type epitaxial layer. For the ion-injection of p-type impurities, a mask having a plurality of dot-like openings arranged in lattice-form may, for example, be used. For the ion-injection of n-type impurities, a mask that covers the portions where the p-type impurities are ion-injected may be used. Next, through several repetitions of the forming of n⁻-type epitaxial layers, ion-injection of p-type impurities and ion-injection of n-type impurities, and subsequent annealing, the super junction structure is formed with the n-type pillar layer 3 formed by multilevel n-type diffusion regions and the p-type pillar layers 4 formed by multi-level p-type diffusion layers.

Moreover, the n-type pillar layer 3 and the p-type pillar layers 4 can be formed as follows. After forming the n-type epitaxial layer on the n⁻-type buffer layer, p-type impurities are injected from the surface at positions where the p-type pillar layers 4 are formed as described above. Next, through several repetitions of the forming of n-type epitaxial layers and ion-injection of p-type impurities and subsequent annealing, the super junction structure is formed with the n-type pillar layer 3 formed by the n-type epitaxial layer and the p-type pillar layers 4 formed by multi-level p-type impurity diffusion layers. In this case, the n-type epitaxial layer is used unaltered as the n-type pillar layer 3, and so the manufacturing process can be shortened.

As illustrated in FIG. 2B, each layer of the plurality of p-type base layers 5 is provided island-like on a top portion of a corresponding one of the plurality of p-type pillar layers 4 and is electrically connected thereto. The island-like p-type base layer 5 includes a planar region that is seen to extend outside a corresponding planar region of the p-type pillar layer 4 when the arrangement is viewed along a direction normal to the major surface of the n⁺-type drain layer. In a similar manner to the p-type pillar layer 3, the p-type base layers 5 are arranged in columns (not shown) which extend in the Y direction of the n⁺-type drain layer 1 and which are disposed with an equal interval in the X direction. Along each column the p-type base layers 5 are disposed with an equal interval in the Y direction. Thus, when the arrangement is viewed along a normal direction to the first major surface, the plurality of island-like p-type base layers 5 are seen to be arranged in lattice-form within the n-type pillar layer 3. As a result of the plurality of p-type base layers 5 being provided in lattice-form in the n-type pillar layer 3, the n-type pillar layer 3 has a lattice form with stripes extending in the Y direction and the X direction. In other words, the lattice-form plurality of p-type base layers 5 are the openings of the lattice formed by the n-type pillar layer 3 having the lattice form. The p-type base layers 5 have a higher p-type impurity concentration than the p-type pillar layers 4.

The n⁺-type source layer 6 is selectively formed on the top surface of each of the plurality of p-type base layers 5. The n⁺-type source layers 6 have a higher n-type impurity concentration than the n-type pillar layers 3. The n⁺-type source layers 6 are formed at both edge portions of the top surface of the p-type base layers 5 in X direction, and are separated from top end portions of the n-type pillar layer 3 by interposing the p-type base layers 4 between the n-type pillar layer 3 and the n⁺-type source layers 6. The n⁺-type source layers 6 are not formed at both edge portions of the top surface of the p-type base layers 5 in Y direction. The p⁺-type contact layer 7 is formed in a region between the n⁺-type source layers 6 of the top surface of the p-type base layer 5. The p⁺-type contact layer 7 is a layer provided to lower on resistance by making an ohmic contact with a later-described source electrode 14. When this layer is not provided, the only result is that the on resistance increases slightly. This does not influence the effects of, or depart from the technological spirit of the invention.

The p-type base junction layer 8 is formed on a top end portion of the n-type pillar layer 3 along the Y direction so as to be electrically connected to the p-type base layers 5 that is adjacent along the Y direction. A bottom portion of the p-type base junction layer 8 is formed (more deeply) extending further toward the n⁺-type drain layer 1 than a bottom portion of the p-type base layer 5, and is electrically connected to the top end portions of adjacent p-type pillar layers 4, which are connected under the adjacent p-type base layers 5. Thus the adjacent p-type base layers 5 and the adjacent p-type pillar layer 4 are electrically connected along the Y direction by the p-type base junction layer 8.

A first portion 9 of an n-type J-FET layer (seventh semiconductor layer) 9 is formed on the top end portion of the n-type pillar layer 3 so as to extend in the Y direction, is interposed between the two p-type base layers 5 which are adjacent in the X direction and is joined to the two p-type base layers 5. The n-type J-FET layer 9 has an n-type impurity concentration approximately equal to or higher than that of the n-type pillar layer 3.

As illustrated in FIG. 3, the gate electrode 11 is formed, via gate insulating film 10 on the n-type pillar layer 3, the plurality of p-type base junction layers 8, the plurality of p-type base layers 5, and the plurality of n⁺-type source layers 3. The gate electrode 11 includes a plurality of openings formed so as to be within the planar regions formed by the p-type base layers 5, as seen when the arrangement is viewed along a direction normal to the first major surface of the n⁺-type drain layer. The arrangement is such that portions of the n⁺-type source layer 6 and the p⁺-type contact layer 7 are exposed in the openings. In other words, edges of the openings are arranged to be over the n-type source layers 6 formed on the top surface of the p-type base layer 5. For the gate electrodes 11, impurity doped polysilicon may, for example, be used. For the gate insulating film 10, a thermally oxidized film may, for example, be used. The gate electrode 11 is formed so as to bridge between adjacent p-type base layers and cover the n-type pillar layer 3 existing between the p-type base layers 5. The interlayer insulating layer 12 is formed to cover the gate electrode 11. For the interlayer insulating layer 12, a silicon oxide film or the like formed by a Chemical Vapor Deposition (CVD) method or the like may, for example, be used. In this embodiment, the gate electrode 11 is formed with a lattice form in the X direction and the Y direction so as to cover all intervals between the island-like p-type base layers 5. Hence, the gate-drain capacitance can be increased in comparison to when stripe-form gate electrodes are formed.

The drain electrode 13 is electrically connected to the second major surface of the $n^+$-type drain layer 1. The source electrode 14 is insulated from the gate electrode 11 by the interlayer insulating layer 12 and is in ohmic contact with the plurality of $p^+$-type contact layers 7 and the plurality of $n^+$-type source layers 6 via the plurality of openings in the gate electrode 11. The p-type base layer 5 is electrically connected to the source electrode 14 via the $p^+$-type contact layers 7. For the drain electrode 13 and source electrode 14, a metal such as aluminum or copper may be used.

Next the operation and characteristics of the MOSFET 100 according to this embodiment are described with reference to FIG. 4. In the MOSFET 100 according to this embodiment, when a positive potential is being applied to the drain electrode 13 with respect to the source electrode 14 and a positive potential that exceeds a threshold value is applied to the gate electrode 11, a channel layer is formed by population inversion in the top surface of the p-type base layer 7 directly under the gate electrode 11. Current flows via the channel layer through the drain electrode 13, the $n^+$-type drain layer 1, the $n^-$-type buffer layer, the n-type pillar layer 3, the n-type J-FET layer 9, the p-type base layer 5, the $n^+$-type source layers 6 and the source electrode 14. The on-state current flowing when the MOSFET 100 is in the ON state flows in a portion that connects the p-type base layer 5 and the n-type pillar layers (or a portion that connects the p-type base layer 5 and the n-type J-FET layer 9). Hence, in this embodiment, since the p-type base layer 5 and the p-type base junction layer 8 are joined in the Y direction, the on-state current does not flow easily in the Y direction. Since, the p-type base layer 5 is joined to the n-type pillar layer in the X direction, the current flows easily in the X direction. Consequently, as described above, it is not necessary to form the $n^+$-type source layer 6 at the two Y direction edges of the top surface of the p-type base layer 5 and the $n^+$-type source layer 6 is formed only at the two X direction edges of the top surface of the p-type base layer 5.

The on-state current flowing from the drain electrode 13 to the n-type pillar layer 3, flows from the entire n-type pillar layer 3 to both X direction edges of the p-type base layer via the n-type J-FET layers 9, and flows into the source electrode via the $n^+$-type source layers 6. Here, the n-type J-FET layer 9 acts to reduce the resistance of a current path from the n-type pillar layer 3 to the p-type base layer 5. The higher the n-type impurity concentration of the n-type J-FET layer 9, the lower it is possible to set the resistance of the current path. Further, by forming the n-type J-FET layer 9 in stripe form on the n-type pillar layer 3 along the Y direction, the on-state current can be caused to diffuse in the Y direction of the n-type pillar layer 3 and the on resistance can be further reduced.

In this embodiment, a first portion of the n-type J-FET layer 9 (in this embodiment, the first portion only) is formed in a stripe-form so as to extend continuously along the surface of the n-type pillar layer 3 in the Y direction. However, it is sufficient that a portion is formed between the p-type base layers 5 that are adjacent in the X direction (the case in which the first portion of the n-type J-FET layer 9 extends in the Y direction with separation therebetween). In this case, however, the on resistance would be slightly higher than in this embodiment. Even if the n-type J-FET layer 9 is not formed on any part of the n-type pillar layer 3 in the Y direction, the on resistance of the MOSFET 100 does rise, but the advantages of the invention are not adversely affected and such arrangements should be construed as being within the technological spirit of the invention.

Next, the case in which a potential lower than the threshold value is applied to the gate electrode 11 and the MOSFET 100 is in an OFF state is considered. When the MOSFET 100 is switched OFF, the depletion layers begins to expand from the p-n junction interfaces of the n-type pillar layers 3 and the p-type pillar layer 4, and the super junction structures configured by the n-type pillar layers 3 and the p-type pillar layer 4 are fully depleted. Here, as illustrated by the broken lines in FIG. 4, when avalanche breakdown occurs at the p-n junction interface of the n-type pillar layer 3 and the p-type pillar layer 4, electrons e and holes h are generated in the avalanche breakdown. The electrons e are discharged to the drain electrode 13 via the n-type pillar layer 3 and the $n^+$-type drain layer 1. The holes h are discharged to the source electrode 14 via the p-type pillar layers 4, the p-type base layer 5, and the $p^+$-type contact layer 7. As illustrated in FIG. 4, the case may be considered in which the interlayer insulating layer 12 is left over in the opening of the gate electrode 11 due to an etching defect or the like, and a contact defect 15 occurs between the source electrode 14 and the $p^+$-type contact layer 7. When the contact defect 15 or the like has occurred, the holes generated in the avalanche breakdown cannot be discharged to the source electrode 14 via the p-type pillar layer 4, the p-type base layer 5, and the $p^+$-type contact layer 7. Consequently, the holes accumulate in the p-type base layer 5, an electric field increases at the interface between the p-type base layer 5 and the n-type J-FET layer 9, and the MOSFET 100 becomes to be destroyed.

By contrast, in the MOSFET 100 according to this embodiment, even if the contact defect 15 occurs, the p-type base layer 5 having the contact defect 15 and the adjacent p-type base layer 5 are electrically connected in the Y direction by the p-type base junction layer 8. Hence, even if avalanche breakdown occurs at the p-n junction interface between the p-type pillar layer 4 and the n-type pillar layer 3 under the p-type base layer 5 having the contact defect 15, the holes resulting from the avalanche breakdown do not accumulate in the p-type base layer 5 having contact defect 15, but are discharged to the source electrode 14 via the adjacent p-type base layer 5 that is joined by the p-type base junction layer 8. Thus, even if the MOSFET 100 according to this embodiment has the contact defect 15 between the p-type base layer 5 and the source electrode 14 due to an etching defect or the like at an opening in the gate electrode 11, it is possible to maintain a high avalanche resistance for the MOSFET 100.

In this embodiment, the p-type base junction layer 8 extends further towards the $n^+$-type drain layer 1 side than the p-type base layer 5, and is further formed so as to electrically connect the two adjacent p-type pillar layers 4 formed under the p-type base layer 5, further toward the $n^+$-type drain layer 1 side than the p-type base layer 5. Consequently, the holes generated in the avalanche breakdown do not only flow between the adjacent two p-type base layers 5, but also flow between the adjacent two p-type pillar layers 4. Thus, the resistance to discharge of the holes is further reduced and the avalanche resistance of the MOSFET 100 is maintained at a high level. Accordingly, the further the p-type base junction layer 8 is extended towards the $n^+$-type drain layer 1 side, the further the resistance to discharge of the holes is reduced and thus the further avalanche resistance increases.

However, the further a bottom portion of the p-type base junction layer 8 extends toward the $n^+$-type drain layer 1 side, the greater a reduction in thickness in a stacking direction of the super junction configured by the p-type pillar layers 4 and the n-type pillar layer 3, and the greater the corresponding reduction in the withstand voltage. Also, when the MOSFET 100 is in the on-state, the flow of the on-state current diffused in the n-type pillar layer directly below the p-type base junction layer 8 is restricted, and consequently, the on resistance increases. Thus, the degree to which the bottom portion of the p-type base junction layer 8 is caused to extend towards the n⁺-type drain layer 1 in the normal direction to the first major surface (the depth of the p-type base junction layer 8) should be set by design.

It is also possible to form the p-type base junction layer 8 to be shallower than the p-type base layer 5 so that the bottom portion of the p-type base junction layer 8 is arranged to be further towards the gate electrode 11 side than the bottom portion of the p-type base layer 5. In this case the p-type base junction layer 8 is formed only between adjacent two p-type base layers 5 only, is joined only to the two p-type base layers 5, and is not connected to the adjacent two p-type pillar layers 4 below. Here, when the contact defect 15 occurs between the source electrode 14 and the p-type base layer 5, the resistance to discharge of the holes generated by the avalanche breakdown is higher than in the case that the p-type base junction layer 8 is formed to be deeper than the p-type base layer 5. However, this configuration is of course possible according to the specification of the MOSFET 100.

Figure 5A:
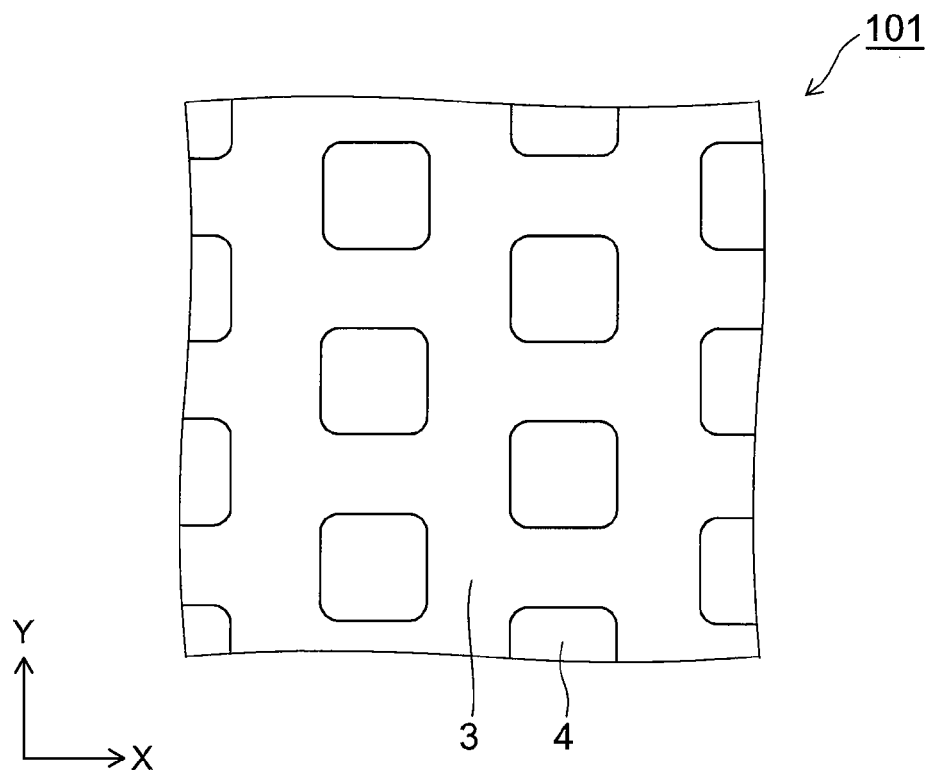
FIG. 5A is a plan view of the main constituents in a horizontal plane corresponding to the horizontal plane through A-A in the perspective view of FIG. 1, of the power semiconductor device according to a first modification example of the first embodiment.
Figure 5B:
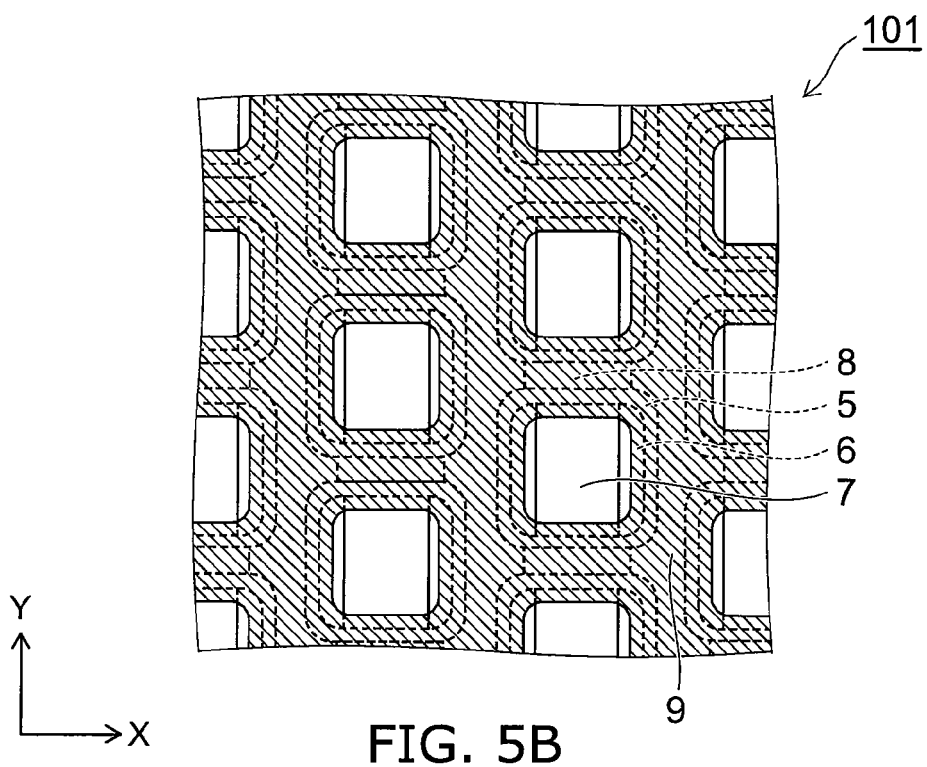
FIG. 5B is a plan view corresponding to a view from above of the arrangement in the perspective view of FIG. 1, of the power semiconductor device according to the first modification example of the first embodiment.

Next, a MOSFET of a first modification example of this embodiment will be described with reference to FIGS. 5A and 5B. FIG. 5A is a plan view of the main constituents in a horizontal plane corresponding to the horizontal plane through A-A in the perspective view of FIG. 1, of the power semiconductor device according to the first modification example of the first embodiment. FIG. 5B is a plan view corresponding to a view from above of the arrangement in the perspective view of FIG. 1, of the power semiconductor device according to the first modification example of the first embodiment. Note that the same numerals and symbols are used for portions of the configuration identical to those described in this embodiment, and further descriptions of these portions are omitted. The description is mainly about differences from this embodiment.

The MOSFET 101 according to the first modification example of this embodiment differs from the MOSFET 100 according to this embodiment in the way that the n-type pillar layers 3 and p-type pillar layers 4 are arranged in the horizontal plane, but is otherwise identical in structure to the MOSFET 100 according to this embodiment. Hence, a drawing equivalent to the perspective view of FIG. 1 is not used for describing the MOSFET 101 according to the first modification example of this embodiment. The first modification example is described using the plan view of the horizontal plane corresponding to the horizontal plane through A-A in the perspective view of FIG. 1 (FIG. 5A), and the plan view corresponding to a view from above of the arrangement in the perspective view of FIG. 1 (FIG. 5B).

As illustrated in FIGS. 5A and 5B, the MOSFET 101 of the first modification example of this embodiment is arranged similarly to the MOSFET 100 according to this embodiment. Columnar p-type pillar layers 4 that extend in a direction normal to the first major surface of the n⁺-type drain layer 1 are arranged within the n-type pillar layer 3 in plurality of columns (not shown in the drawings), the columns extending in the Y direction and being separated by an equal interval in the X direction, and the columnar p-type pillar layers 4 being separated by an equal interval in the Y direction along each column. However, in the MOSFET 101 according to the first modification example of this embodiment, a central position in the Y direction between two p-type pillar layers 4 that are adjacent in the Y direction of one column of the plurality of columns is positioned to be adjacent in the X direction to one of the p-type pillar layers 4 arranged in each of the columns adjacent to the above-described column. In other words, in every other column in the X direction, the arrangement of the p-type pillar layers 4 is shifted in the Y direction by half a period of the arrangement interval in the Y direction. The plurality of p-type pillar layers 4 is arranged in an offset lattice-form or staggered-lattice-form within the n-type pillar layer 3, and the n-type pillar layer is arranged in an offset lattice or staggered-lattice. On this point, the MOSFET 101 of the first modification example 1 of this embodiment differs from the MOSFET 100 according to this embodiment. In the MOSFET 101 of the first modification example of this embodiment, as in the MOSFET 100 according to this embodiment, even if a contact defect 15 occurs between the p-type base layer 5 and the source electrode 14, the p-type base layer 5 having the contact defect 15 and the adjacent p-type base layer 5 are still electrically connected in the Y direction by the p-type base junction layer 8. Hence, even if avalanche breakdown occurs at the p-n junction interface between the p-type pillar layer 4 and the n-type pillar layer 3 under the p-type base layer 5 having the contact defect 15, the holes resulting from the avalanche breakdown do not accumulate in the p-type base layer 5 having contact defect 15, but are discharged to the source electrode 14 via the adjacent p-type base layer 5 which is joined by the p-type base junction layer 8. Thus, even if the MOSFET 101 has the contact defect 15 between the p-type base layer 5 and the source electrode 14 due to an etching defect or the like in the manufacturing process at an opening in the gate electrode 11, it is possible to maintain a high avalanche resistance.

Figure 6A:
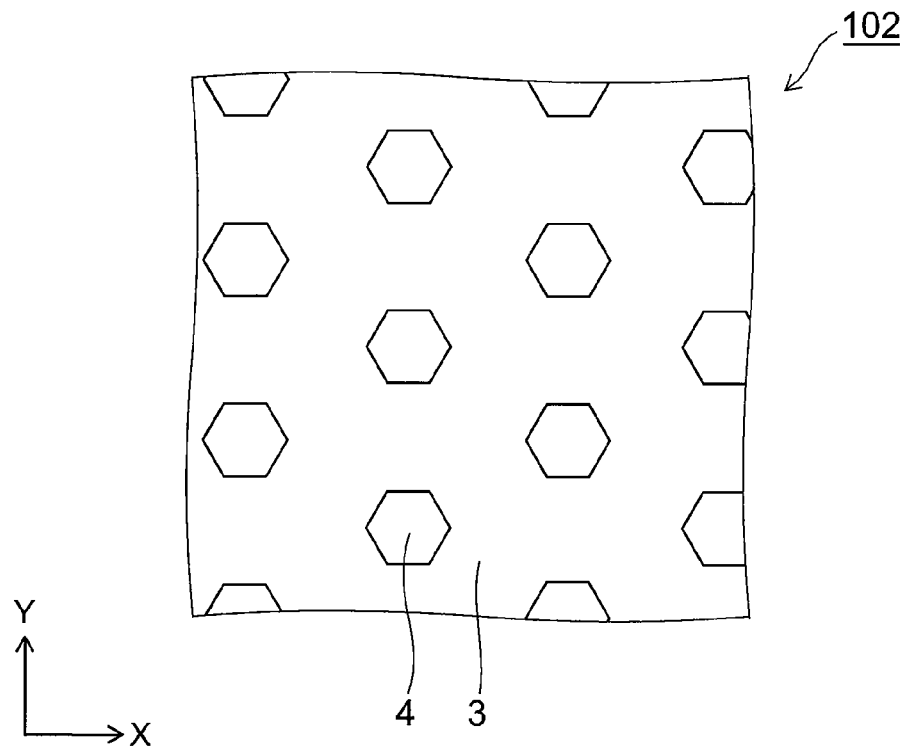
FIG. 6A is a plan view of the main constituents in a horizontal plane corresponding to the horizontal plane through A-A in the perspective view of FIG. 1, of the power semiconductor device according to the second modification example of the first embodiment.
Figure 6B:
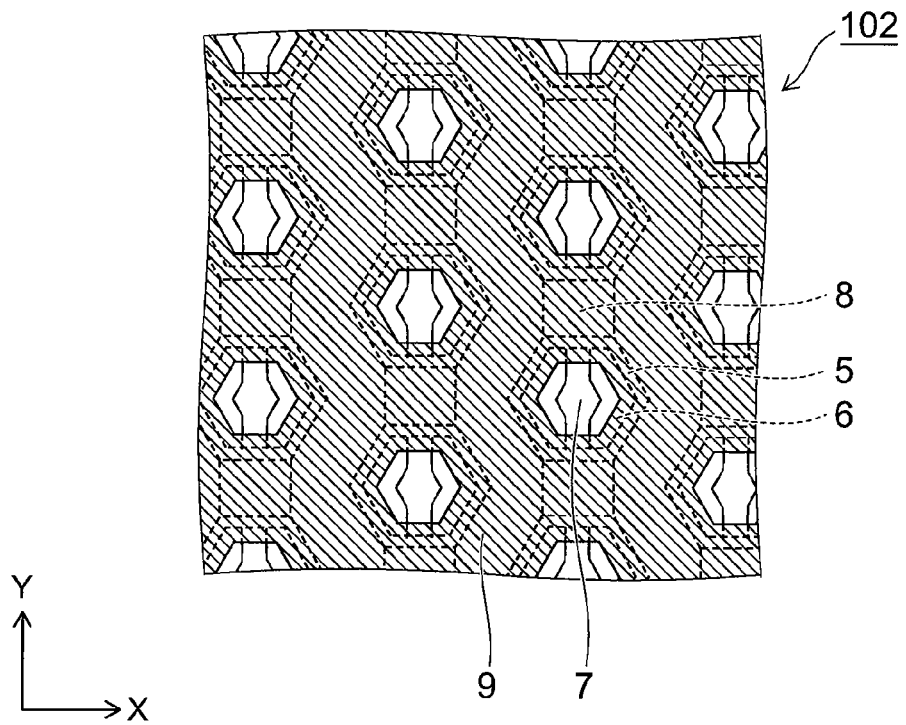
FIG. 6B is a plan view corresponding to a view from above of the arrangement in the perspective view of FIG. 1, of the power semiconductor device according to the second modification example of the first embodiment.

Next, a MOSFET 102 according to a second modification example of this embodiment is described with reference to FIGS. 6A and 6B. FIG. 6A is a plan view of the main constituents in a horizontal plane corresponding to the horizontal plane through A-A in the perspective view of FIG. 1, of the power semiconductor device according to the second modification example of the first embodiment. FIG. 6B is a plan view corresponding to a view from above of the arrangement in the perspective view of FIG. 1, of the power semiconductor device according to the second modification example of the first embodiment. Note that the same numerals and symbols are used for portions of the configuration identical to those already described in this embodiment, and further descriptions of these portions are omitted. The description is mainly about differences from this embodiment.

Like the MOSFET 101 according to the first modification example, the MOSFET 102 according to the second modification example of this embodiment differs from the MOSFET 100 according to this embodiment in the way that the n-type pillar layers 3 and p-type pillar layers 4 are arranged in the horizontal plane, but is otherwise identical in structure to the MOSFET 100 according to this embodiment. In the following, the differences from the MOSFET 101 according to the first modification example are described.

The MOSFET 102 according to the second modification example has the arrangement of the p-type pillar layers 4 and the p-type base layers 5 of the MOSFET 101 of the first modification example. However, the planar profile of each p-type base layer 5 and p-type pillar layer 4 when viewed in a direction normal to the n⁺-type drain layer 1 is a regular hexagon arranged with a pair of opposing sides parallel to the X direction. In other words, the plurality of hexagonal-column-form p-type pillar layers 4 and hexagonal-island-like p-type base layers 5 on the top ends of the p-type pillar layers 4 are arranged in a honeycomb-form within the n-type pillar layer 3 and thus form a honeycomb structure. The gate electrode 11 has a regular hexagonal opening over each of the plurality of p-type base layers 5. The n$^+$-type source layer 6 is formed under each of the pair of opposing sides, aligned in the X direction, of the sides of the hexagonal openings in the gate electrode 11. Also, the p$^+$-type contact layer 7 is formed in the top surface of the p-type base layer 5 between the n$^+$-type source layers 6. An on-state current flows along the X direction in the n-type pillar layer 3, the p-type base layer 5 and the n$^+$-type source layers 6. Except for the difference described above, the MOSFET 102 according to the second modification example of this embodiment is identical in structure to this embodiment and to the first modification example of this embodiment.

Since the MOSFET 102 according to the second modification example of this embodiment differs only in the pattern of the arrangement of the p-type pillar layers 4 within the n-type pillar layer 3, effects similar to those of the MOSFET 100 of this embodiment and the MOSFET 101 according to the first modification example of this embodiment can be obtained.

Second Embodiment

Figure 7:
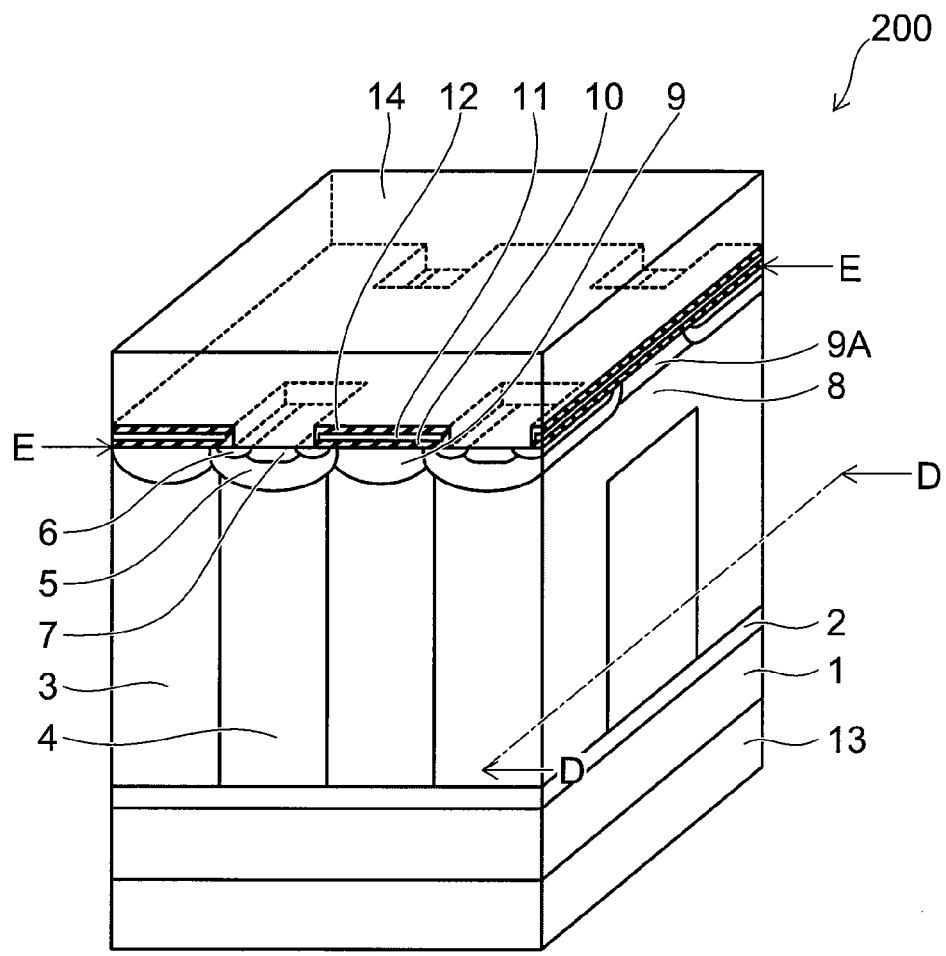
FIG. 7 is a perspective view of the main constituents of a power semiconductor device according to a second embodiment.
Figure 8A:
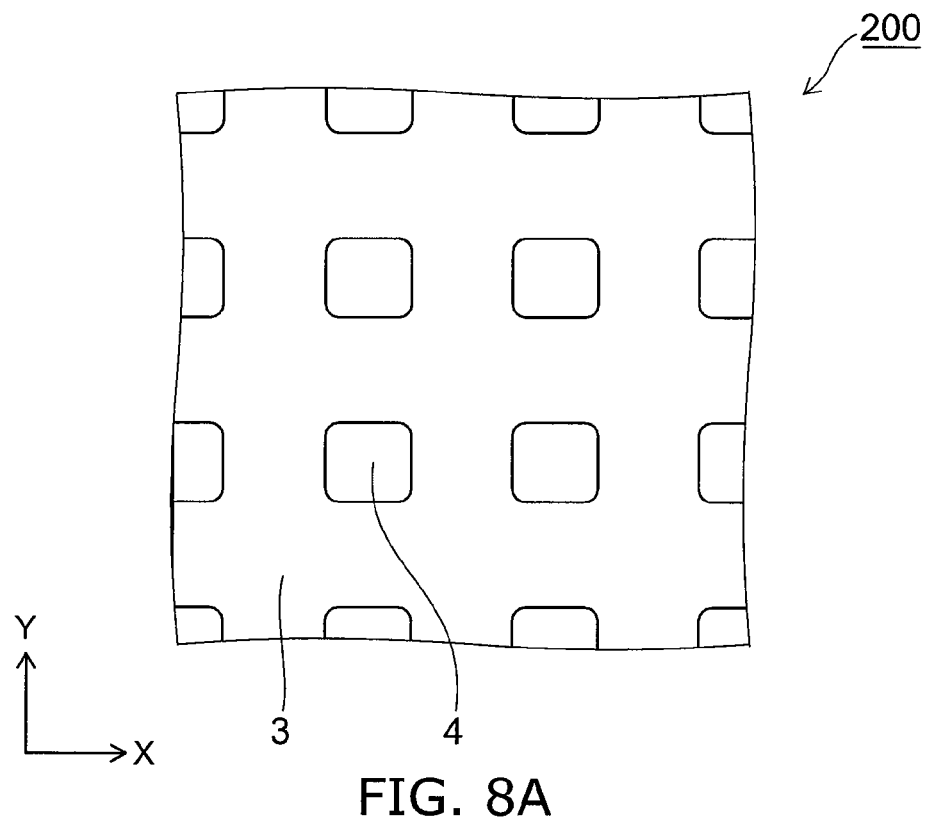
FIG. 8A is a plan view of the main constituents in a horizontal plane through D-D in the perspective view of FIG. 7.
Figure 8B:
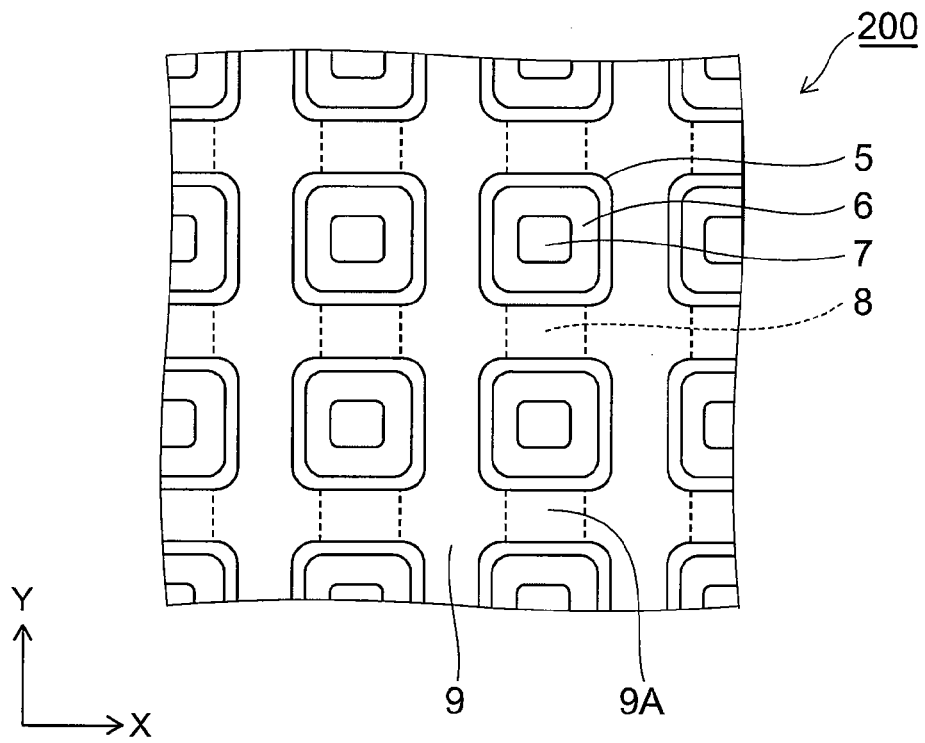
FIG. 8B is a plan view of the main constituents in a horizontal plane through E-E in the perspective view of FIG. 7.
Figure 9:
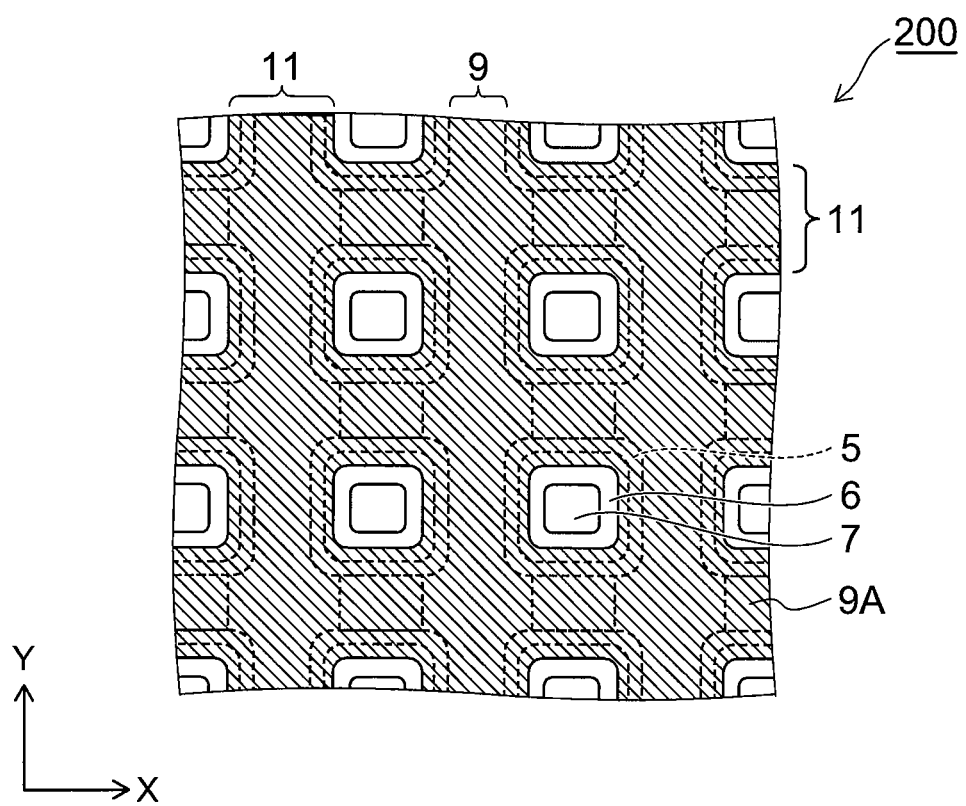
FIG. 9 is a plan view of the main constituents of the power semiconductor device according to the second embodiment, showing the same portion as the perspective view of FIG. 7 viewed from above with the source electrode 14 and the interlayer insulating film 12 omitted.

A second embodiment is described with reference to FIGS. 7 to 9. FIG. 7 is a perspective view of the main constituents of a power semiconductor device 200 according to the second embodiment. FIG. 8A is a plan view of the main constituents in a horizontal plane through D-D in the perspective view of FIG. 7 and FIG. 8B is a plan view of the main constituents in a horizontal plane through E-E in the perspective view of FIG. 7. FIG. 9 is a plan view of the main constituents of the power semiconductor device according to the second embodiment, showing the same portion as the perspective view of FIG. 7 viewed from above with the source electrode 14 and the interlayer insulating film 12 omitted. The broken line in FIG. 9 indicates a layer hidden under a gate electrode 11. FIGS. 7 to 9 each illustrate a main portion of the device regions through which a current of the MOSFET 200 flows. Since edge regions, which are regions outside the device regions, are not within the scope of the invention, descriptions of such regions have been omitted. Note that the same numerals and symbols are used for portions of the configuration identical to those described in the first embodiment, and further descriptions of these portions are omitted. The description is mainly about differences from the first embodiment.

As illustrated in FIGS. 7 to 9, the MOSFET 200 according to the second embodiment is the MOSFET 100 according to the first embodiment, further including a second portion 9A of the n-type FET connected to two p-type base layers 5 that are adjacent in the Y direction and formed in the top surface of the p-type base junction layer 8. In other words, the n-type J-FET layer 9 includes a first portion 9 that is formed in the top surface of the n-type pillar layer and extends in the Y direction and the second portion 9A that is joined to the first portion and extends in the X direction. The n-type J-FET layer 9 surrounds a periphery of each of a plurality of the p-type base layers 5 in a plane parallel to the n$^+$-type drain layer 1 with the first portion 9 and the second portion 9A.

In the MOSFET 200 according to this embodiment, the second portion 9A of the n-type J-FET layer 9 is electrically connected to the p-type base layer 5 in the Y direction, and on-state current can therefore flow in this portion. Hence, the MOSFET 200 has n$^+$-type source layers 6 at both Y direction edges of the top surface of the p-type base layers 5. The MOSFET 200 includes the n$^+$-type source layers 6 in a ring-form in the top surface of the p-type base layers 5, and the p$^+$-type contact layer 7 in the top surface of the p-type base layer 5 in the region within the n$^+$-type source layers 6. On this point, the MOSFET 200 of this embodiment differs from the MOSFET 100 according to the first embodiment. Otherwise, the two embodiments are identical in structure.

In the MOSFET 200, the above-described structure provides an n$^+$-type source layer 6/p-type base layer 5/n-type J-FET layer 9 channel structure formed not only along the X direction but also along the Y direction. As a result, in addition to the on-state current flowing along a path formed by the n-type pillar layer 3, the first portion 9 of the n-type J-FET layer, the p-type base layer 5 along the X direction, and the n$^+$-type source layer 6 along the X direction, the on-state current flows along a path formed by the n-type pillar layer 3, the first portion 9 of the n-type J-FET layer, the second portion 9A of the n-type J-FET layer, the p-type base layer 5 along the Y direction, and the n$^+$-type source layers 6 along the Y direction. Consequently, the MOSFET 200 according to this embodiment has a lower channel resistance, and thus a lower on resistance than the MOSFET 100 according to the first embodiment.

In FIG. 7, the second portion 9A of the n-type J-FET layer is formed on the top surface of the p-type base junction layer 8 along the Y direction and is joined to the p-type base layers 5 that are adjacent in the Y direction. The bottom portion of the second portion 9A of the n-type J-FET layer is formed further toward the gate electrode 11 (shallower) than the bottom portion of the p-type base layer 5. As the bottom portion of the second portion 9A of the n-type J-FET layer is formed further towards the n$^+$-type drain layer 1 (deeper) than the bottom portion of the p-type base layer 5, the channel resistance of the n$^+$-type source layers 6/p-type base layer 5/second portion 9A of the n-type J-FET along the Y direction is reduced. However, as the bottom portion of the second portion 9A of the n-type J-FET layer is formed deeper, a cross-sectional area in the Y direction of the p-type base junction layer 8 interposed between the second portion 9A of the n-type J-FET layer and the n-type pillar layers 3 is reduced. The result is that the resistance to discharge of the holes generated at avalanche breakdown increases and avalanche resistance of the MOSFET 200 is reduced. Thus, the positioning of the bottom portion of the second portion 9A of the n-type J-FET layer and the bottom portion of the p-type base junction layer 8 should be optimized by design.

In the MOSFET 200 according to this embodiment, as in the MOSFET 100 according to the first embodiment, even if a contact defect 15 occurs between the p-type base layer 5 and the source electrode 14, the p-type base layer 5 having the contact defect 15 and the adjacent p-type base layer 5 are still electrically connected in the Y direction by the p-type base junction layer 8. Hence, even if avalanche breakdown occurs at the p-n junction interface between the p-type pillar layer 4 and the n-type pillar layer 3 under the p-type base layer 5 having the contact defect 15, the holes resulting from the avalanche breakdown do not accumulate in the p-type base layer 5 having the contact defect 15, but are discharged to the source electrode 14 via the adjacent p-type base layer 5 which is connected by the p-type base junction layer 8. Thus, even if the MOSFET 200 has the contact defect 15 between the p-type base layer 5 and the source electrode 14 due to an etching defect or the like in the manufacturing process at an opening in the gate electrode 11, it is possible to maintain a high avalanche resistance.

Moreover, because the MOSFET 200 according to this embodiment includes the second portion 9A of the n-type J-FET layer connected to the two adjacent p-type base layers 5 in the Y direction in the top surface of the p-type base junction layer 8, the n$^+$-type source layer 6/p-type base layer 5/n-type J-FET layer 9 channel structure is formed not only along the X direction, but also along the Y direction. Consequently, the MOSFET 200 according to this embodiment has an even lower on resistance than the MOSFET 100 according to the first embodiment.

Although omitted from the above description, the modifications of the first modification example and the second modification example of the first embodiment may naturally be applied to this embodiment.

Third Embodiment

Figure 10A:
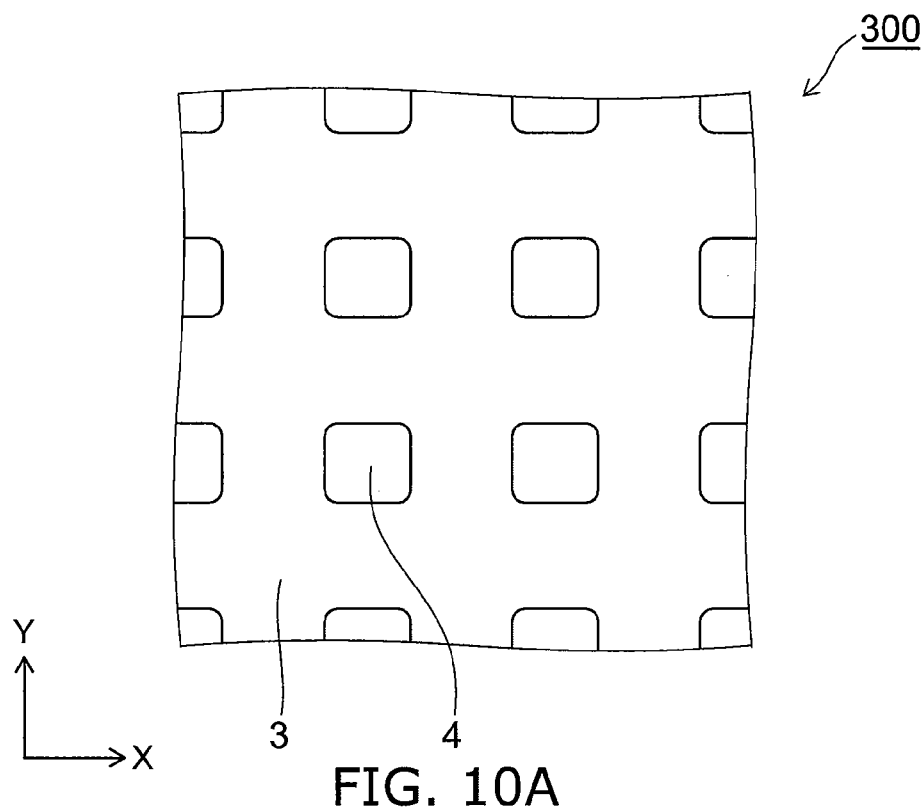
FIG. 10A is a plan view of the main constituents in a horizontal plane through a position corresponding to A-A in the perspective view of FIG. 1, of the power semiconductor device according to a third embodiment
Figure 10B:
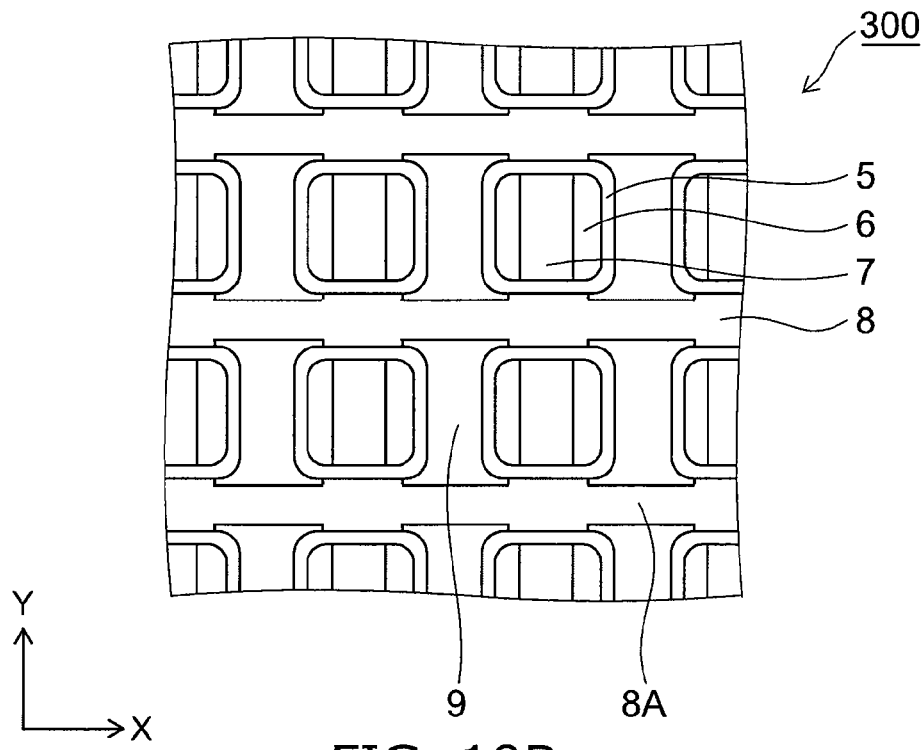
FIG. 10B is a plan view of the main constituents in a horizontal plane at a position corresponding to B-B in the perspective view of FIG. 1, of the power semiconductor device according to the third embodiment.
Figure 11:
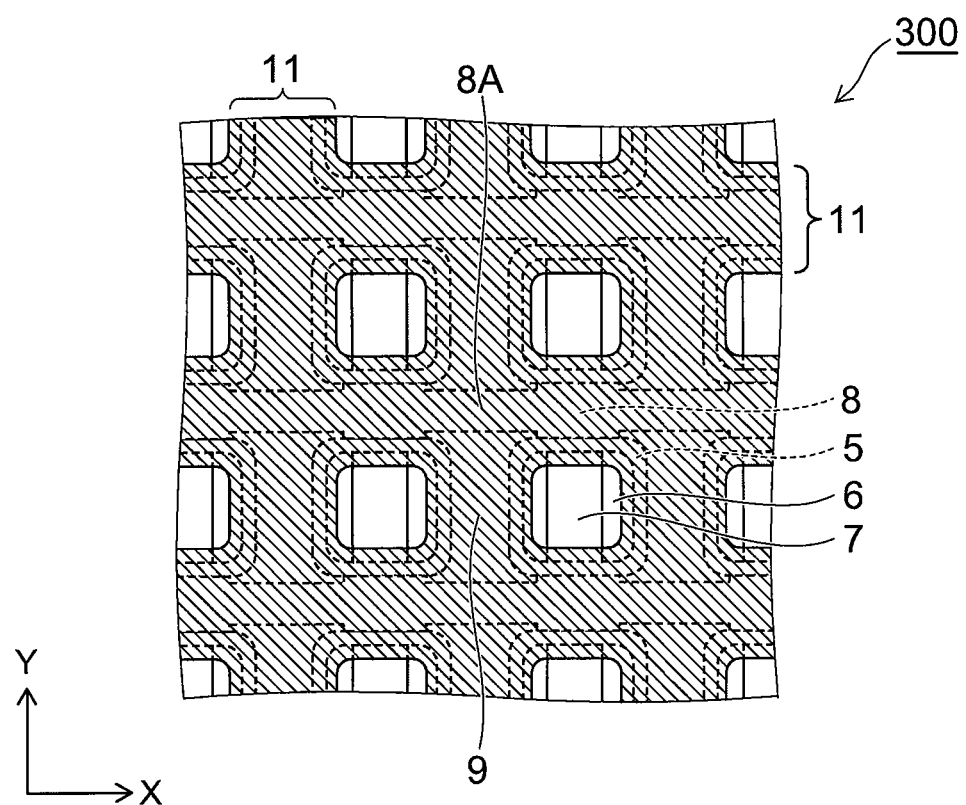
FIG. 11 is a plan view of the main constituents of the power semiconductor device according to the third embodiment, showing the same portion as the perspective view of FIG. 1 viewed from above with the source electrode 14 and the interlayer insulating film 12 omitted.

A third embodiment is described with reference to FIGS. 10A, 10B and 11. FIG. 10A is a plan view of the main constituents in a horizontal plane through a position corresponding to A-A in the perspective view of FIG. 1 and FIG. 10B is a plan view of the main constituents in a horizontal plane at a position corresponding to B-B in the perspective view of FIG. 1, both FIG. 10A and FIG. 10B illustrating the power semiconductor device according to the third embodiment. FIG. 11 is a plan view of the main constituents of the power semiconductor device according to the third embodiment, showing the same portion as the perspective view of FIG. 1 viewed from above with the source electrode 14 and the interlayer insulating film 12 omitted. The broken line in FIG. 11 indicates a layer hidden under the gate electrode 11. FIGS. 10A, 10B and 11 each illustrate a main portion of the device regions through which a current of a MOSFET 300 flows. Since edge regions, which are regions outside the device regions, are not within the scope of the invention, descriptions of such regions have been omitted. Note that the same numerals and symbols are used for portions of the configuration identical to those described in the first embodiment, and further descriptions of these portions are omitted. Also, because of the similarity between the perspective view of the main constituents of the power semiconductor device according to this embodiment and the perspective view of the main constituents of the first embodiment, the perspective view of the main constituents of this embodiment is omitted. The description is mainly about differences from the first embodiment.

As illustrated in FIGS. 10A, 10B and 11, the MOSFET 300 according to the third embodiment is the MOSFET 100 according to the first embodiment, further including a coupling portion 8A formed from a p-type semiconductor layer. The coupling portion 8A couples one of the p-type base junction layers 8 with one other of the p-type base junction layers 8 in the X direction. The one of the p-type base junction layers 8 is arranged in any one column of the plurality of columns in which the plurality of p-type base layers 5 are arranged. The one other of the p-type base junction layers 8 is arranged in the adjacent column of the plurality of columns. The coupling portion 8A can have the same p-type impurity concentration as the p-type base junction layer 8 and can be formed integrally with the p-type base junction layer 8. Thus, because any adjacent two of p-type base junction layers 8 are connected by the coupling portion 8A, the holes generated by avalanche breakdown that occurs under the p-type base layer 5 having the contact defect 15 are discharged not only from the p-type base layers 5 adjacent in the Y direction but also from the p-type base layers 5 adjacent in the X direction. Hence, the resistance to discharging holes is further reduced and the avalanche resistance of the MOSFET 300 is increased.

In FIG. 10B, the n-type J-FET layer 9 formed on the top surface of the n-type pillar layer 3 is distributed along the Y direction, separated by the coupling portions 8A of the p-type base junction layer 8 in the Y direction. However, it is naturally possible to also form the n-type J-FET layer 9 in the p-type coupling layer 8A to have the n-type J-FET layer 9 extend continuously along the Y direction. In the latter case, the on-state current is diffused in the Y direction within the n-type pillar layers 3 by the n-type J-FET layer 9, further reducing on resistance.

Further, as described in the second embodiment, a second portion of the n-type J-FET layer 9 may be provided in the top surface of the p-type base junction layer 8 that joins any two adjacent p-type base layer 5 along the Y direction. In this case, the n-type J-FET layer 9 having the integral first portion 9 and second portion 9A is formed over the n-type pillar layer 3, the p-type base junction layer 8, and the top surface of the coupling portion 8A of the p-type base junction layer 8.

In the MOSFET 300 according to this embodiment, as in the MOSFET 100 according to the first embodiment, even if a contact defect 15 occurs between the p-type base layer 5 and the source electrode 14, the p-type base layer 5 having the contact defect 15 and the adjacent p-type base layer 5 are still electrically connected in the Y direction by the p-type base junction layer 8. Hence, even if avalanche breakdown occurs at the p-n junction interface between the p-type pillar layer 4 and the n-type pillar layer 3 under the p-type base layer 5 having the contact defect 15, the holes resulting from the avalanche breakdown do not accumulate in the p-type base layer 5 having contact defect 15, but are discharged to the source electrode 14 via the adjacent p-type base layer 5 that is joined by the p-type base junction layer 8. Thus, even if the MOSFET 300 has the contact defect 15 between the p-type base layer 5 and the source electrode 14 due to an etching defect or the like in the manufacturing process at an opening in the gate electrode 11, it is possible to maintain a high avalanche resistance.

Here, the MOSFET 300 according to this embodiment is the MOSFET 100 according to the first embodiment further including the coupling portion 8A. The coupling portion 8A couples one of the p-type base junction layers 8 with one other of the p-type base junction layers 8 in the X direction. The one of the p-type base junction layers 8 is arranged in any one column of the plurality of columns in which the plurality of p-type base layers 5 are arranged. The one other of the p-type base junction layers 8 is arranged in the adjacent column of the plurality of columns. Hence, in the MOSFET 300, the holes generated by avalanche breakdown are discharged not only from the p-type base layers 5 adjacent along the Y direction but also from the p-type base layers adjacent along the X direction. The MOSFET 300 therefore has an even higher avalanche resistance.

Although omitted from the above description, the modifications of the first modification example and the second modification example of the first embodiment may naturally be applied to this embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power semiconductor device comprising: a first semiconductor layer of a first conductivity type; a plurality of mutually separated second semiconductor layers of a second conductivity type, each extending within the first semiconductor layer from a surface of the first semiconductor layer; a plurality of third semiconductor layers of the second conductivity type, each provided on a top end of a corresponding one of the plurality of second semiconductor layers and having an impurity concentration of the second conductivity type higher than an impurity concentration of the second conductivity type of the second semiconductor layers; a plurality of fourth semiconductor layers of the first conductivity type, each selectively provided on a top surface of a corresponding third semiconductor layer; a plurality of fifth semiconductor layers of the second conductivity type, each provided between two adjacent third semiconductor layer and extending beyond a bottom of each third semiconductor layer, each of the fifth semiconductor layers electrically connecting the two adjacent third semiconductor layers and contacting two adjacent second semiconductor layers provided beneath the two adjacent third semiconductor layers respectively, and having an impurity concentration of the second conductivity type lower than the impurity concentration of the second conductivity type of the third semiconductor layers; a gate electrode provided via a gate insulating film on the first semiconductor layer, the plurality of fifth semiconductor layers, the plurality of third semiconductor layers and the plurality of fourth semiconductor layers, the gate electrode including a plurality of openings over the plurality of third semiconductor layers and the plurality of fourth semiconductor layers; an interlayer insulating film provided on the gate electrode; a first electrode that is in electrical connection with the first semiconductor layer; and a second electrode in electrical connection with the plurality of third semiconductor layers and the plurality of fourth semiconductor layers via the openings in the gate electrode.

2. The device according to claim 1, wherein: the plurality of second semiconductor layers and the plurality of third semiconductor layers are arranged along a plurality of columns, each column extending along a first direction that is parallel to the surface of the first semiconductor layer and the columns being disposed along a second direction that is perpendicular to the first direction and parallel to the surface of the first semiconductor layer and the plurality of third semiconductor layers formed along the plurality of columns are electrically connected to each other along the first direction by the plurality of fifth semiconductor layers.

3. The device according to claim 2, further comprising: a sixth semiconductor layer of the first conductivity type provided on a top surface of the first semiconductor layer and having a first portion joined to each of third semiconductor layers adjacent in the second direction of the plurality of third semiconductor layers, wherein the sixth semiconductor layer has an impurity concentration of the first conductivity type that is higher than the impurity concentration of the first conductivity type of the first semiconductor layer.

4. The device according to claim 3, wherein the first portion of the sixth semiconductor layer extends along the first direction.

5. The device according to claim 2, wherein the plurality of third semiconductor layers disposed along each column of the plurality of columns are arranged in lattice form to be separated by equal intervals in the first direction and the second direction.

* * * * *